United States Patent
Bellaouar et al.

(10) Patent No.: US 6,308,049 B1
(45) Date of Patent: Oct. 23, 2001

(54) FRACTIONAL-SPURS SUPPRESSION SCHEME IN FREQUENCY TRACKING MULTI-BAND FRACTIONAL-N PHASE LOCK LOOP

(75) Inventors: Abdellatif Bellaouar, Dallas; Khaled M. Sharaf; Ahmed Reda Fridi, both of Richardson, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/217,222

(22) Filed: Dec. 21, 1998

(51) Int. Cl.⁷ ..................................................... H04B 1/40
(52) U.S. Cl. ........................... 455/76; 455/550; 455/255; 455/260; 455/180.3; 327/156; 327/157; 331/16; 331/1 A; 375/238; 375/353
(58) Field of Search ..................... 331/16, 1 A; 327/148, 327/150, 156, 157; 375/238, 353; 455/550, 255, 257, 258, 259, 260, 76, 180.3, 192.2

(56) References Cited

U.S. PATENT DOCUMENTS

| | | | |
|---|---|---|---|
| 5,343,167 | * 8/1994 | Maumoto et al. ........................ | 331/2 |
| 5,343,510 | * 8/1994 | Fukui ..................................... | 455/550 |
| 5,818,303 | * 10/1998 | Oishi et al. ........................... | 331/1 A |
| 5,834,987 | * 11/1998 | Dent ....................................... | 331/127 |
| 6,112,068 | * 8/2000 | Smith et al. .......................... | 455/260 |
| 6,130,561 | * 12/1998 | Dufour .................................. | 327/105 |

* cited by examiner

Primary Examiner—Dwayne Bost
Assistant Examiner—Lewis G. West
(74) Attorney, Agent, or Firm—Ronald O. Neerings; Wade James Brady, III; Frederick J. Telecky, Jr.

(57) ABSTRACT

The present invention discusses fractional compensation timing circuitry (15) to track a VCO output frequency, $f_O$, and provide highly effective error cancellation in a fractional-N PLL synthesizer. This output frequency tracking is used to suppress spurious sidebands, commonly known as spurs, in both fixed-band and multi-band wireless transceiver applications which use fractional-N PLL synthesizers. Some of the critical parameters which benefit from this type of PLL include switching time, phase noise, and reference feed-through.

18 Claims, 4 Drawing Sheets

FRACTIONAL-SPURS SUPPRESSION SCHEME IN FREQUENCY TRACKING MULTI-BAND FRACTIONAL-N PHASE LOCK LOOP

BACKGROUND OF THE INVENTION

1. Field of the Invention

The present invention relates to frequency tracking in fractional-N phase-lock-loops (PLLs) and more specifically to the suppression of fractional spurs which are present in conventional implementations of both fixed band and multi-band fractional-N PLLs.

2. Brief Description of the Prior Art

PLL based frequency synthesizers are one of the key components in wireless transceivers. Some of the critical parameters of a PLL for wireless applications are switching time, phase noise, and reference feed-through. In the case of time-division multiple access (TDMA) systems, fast switching time from one channel (frequency) to another is required to meet time-slot conditions. Fast switching times can also result in reduced power dissipation which is important in portable systems.

FIG. 1 shows a typical architecture for the type conventional integer-N PLL used predominantly in the wireless market today. In this conventional scheme, N is an integer number. In this circuit, the reference frequency $f_R$, which is divided down by reference divider 2 from the crystal 1, drives the phase detector 3 as does the feedback signal $f_V$, which is the output frequency $f_O$ from the voltage controlled oscillator (VCO), divided by integer N in the main divider 7. The output of the charge pump 4 is coupled to filter 5 to provide a voltage to the VCO 6 so that the relation $f_O = N*f_R$ exists when the PLL is locked. One problem with such a circuit is that reference spurious sidebands exist which tend to show up in the output spectrum.

Fractional-N PLL synthesizers represent another category where the division ratio, N, takes on fractional values. In this case, the output frequency, $f_O$, is stepped in x/m fractions of the reference frequency. A common technique used to realize this is to divide by N+1 every m cycles and then divide by N the rest of the time so that the effective fractional ratio is:

$$N_{eff} = \frac{fo}{fR} = N + \frac{x}{m},$$

where x=0, 1, 2, ... m−1.

The direct implementations of this technique is the potential improvement of the phase noise and switching speed compared to the integer-N PLL discussed above. That is, for the same output frequency $f_O$, if $f_R$ is increased m times, the division ratio is scaled down by the same m factor, resulting in lower phase noise. In addition, since $f_R$ is higher, the loop bandwidth can be made wider so that faster lock time can be realized. Although with fractional-N synthesizers the reference spurs still exist in the output spectrum, they are moved further from the carrier frequency which is an improvement. FIG. 2 shows a block diagram for a typical fractional-N synthesizer. The circuit looks much like that for integer-N synthesizer discussed above, but now the main divider 7 is capable of switching from divide by N to divide by N+1. The divisor ratio is switched from N to N+1 by the overflow signal from an L-bit accumulator 8 which is added to the circuit. The value for the fractional modulus m is given as $2^L = m$, where L is the number of bits in the accumulator. This accumulator is clocked by $f_V$ and is incremented in steps of x, where x is 1, 2, ... m−1 so that an overflow occurs at a rate of x/m. Typical results for this type circuit is as follows:

$f_R$=240 KHz
x=1
L=3 (bits)
$M=2^L=8$
Channel spacing=30 KHz $$N_{eff} = N + \frac{1}{8}.$$

As mentioned above, there is still the problem of fractional spurs associated with this fractional-N PLL synthesizer. With the PLL in lock condition, there is an instantaneous phase error at the input to the phase detector as shown in FIG. 3. This error generates small charge pump current pulses which tend to ramp the control voltage of the VCO. If this error is not canceled, fractional spurious sidebands at $$f_O \pm \frac{x}{m} * f_R$$

will show up in the output frequency spectrum. To suppress these spurious sidebands, fractional-N synthesizers often have internal compensation circuitry, which generates complementary fractional waveforms, to cancel (reduce) the phase error. Using this technique, spurs can be reduced to better than 60 dB.

FIG. 4 shows a typical architecture for a scheme used to cancel the spurs by developing a fractional charge pump compensation signal. This compensation circuitry is used in the analog domain and is based on pulse amplitude modulation (PAM) of the compensating charge pump current pulses. In this case the pulses have constant width and their amplitude is modulated. The content of the L-bit accumulator 8 is feed through a digital-to-analog converter (DAC) 9 and used to modulate the amplitude of the compensation current, which is generated by a fractional charge pump 10. Special fractional timing circuitry 11, driven by the $f_V$ signal from main divider 7, generates the fractional compensation pulse which drives fractional charge pump 10. The theory is that the PAM output from the fractional charge pump 10 cancels the spurious PWM signals from the main charge pump 4. In practice, this results in effective spur suppression as long as the charge (q), or area under each compensating current pulse, is equally matched to the equivalent charge or area of the main charge pump 4 current pulses.

The conventional techniques for spur suppression discussed above, where the fractional timing circuitry is driven at a constant rate from crystal 1 and as a result has a fixed width, works fairly well for single channel, fixed band applications. Since the compensation circuitry 11 does not track the VCO 6 frequency, even for fixed band applications where the frequency may vary as much as 10% when switching from receiver (Rx) to transmitter (Tx) operation, there can be imperfect sideband spurious suppression. However, in dual channel applications, where the frequency bands may change from one band at 900 MHz to another at 1900 MHz or higher, this technique is not effective. The present invention addresses this problem by generating a precise fractional pulse width which has VCO tracking characteristics. The compensation circuitry for this new fractional-N PLL synthesizer approach tracks the variations in the $f_O$ signal at the output of the VCO 6. This is important for both dual band applications where there are large frequency changes and for fixed band applications where $f_O$ may have smaller variations around the fixed frequency.

SUMMARY OF THE INVENTION

Phase-locked-loop (PLL) frequency synthesizers are one of the key components in wireless transceivers. With time-division multiple access (TDMA) systems, fast switching time from one channel (frequency) to another is required to meet time slot conditions. One problem with conventional fractional-N frequency synthesizers is that of spurious sidebands which show up in the frequency spectrum.

The present invention describes a new technique for fractional spurious sideband, known as spurs, suppression in a multi-band fractional-N phase-lock-loop (PLL) synthesizer. This approach generates a precise fractional pulse width signal ($T_{VCO}$) with voltage controlled oscillator (VCO) frequency tracking. The fractional pulse generation is derived directly from the output of the VCO and tracks perfectly the output frequency, as compared to the conventional approach which is driven from a crystal and as a result has a fixed pulse width. This new solution allows for an almost perfect suppression of fractional sideband spurs.

This approach is particularly important in multi-band applications, an example being a dual band, where the output frequency may change between channels (bands) from say 900 MHz to 1900 MHz or higher. In this case, fractional compensation in the conventional circuits is not effective since, although the phase error is a function of the output frequency $f_O$, the fractional timing circuitry which generates the compensation pulse is fixed to a single band and as a result has a constant width. Moreover, even for a fixed band application (such as 1900 MHz), the frequency may change as much as 10% around the fixed band frequency during the receiver $R_X$ and transmitter $T_X$ channel selection and if the fractional pulse width is constant in time then the compensation will not be effective.

DESCRIPTION OF THE PREFERRED EMBODIMENT

Figure 1:
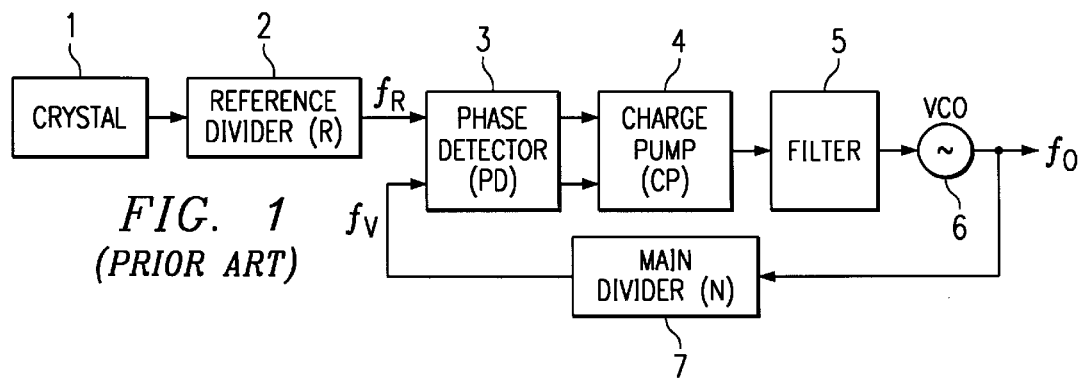
FIG. 1 is a block diagram for a conventional integer-N frequency synthesizer. (prior art)
Figure 2:
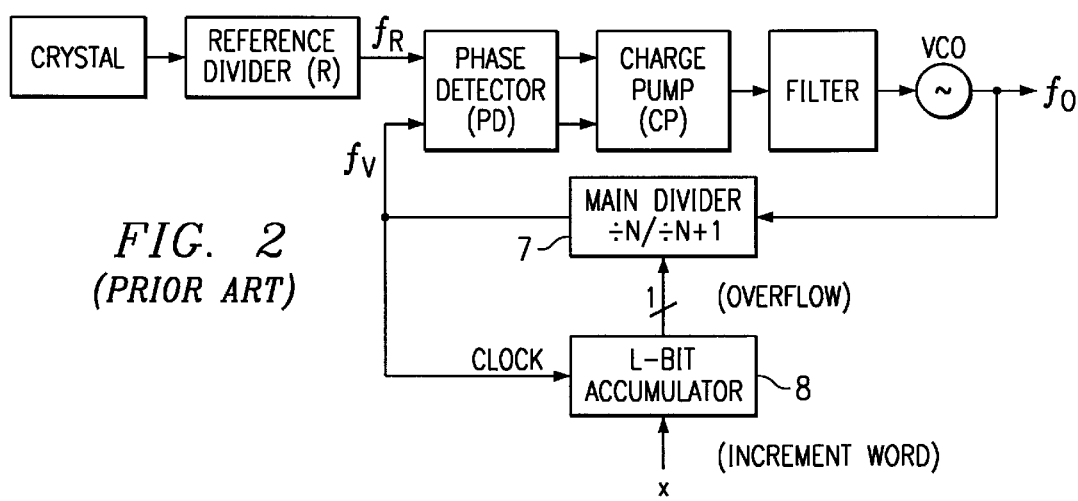
FIG. 2 is a block diagram for a fractional-N synthesizer. (prior art)
Figure 3:
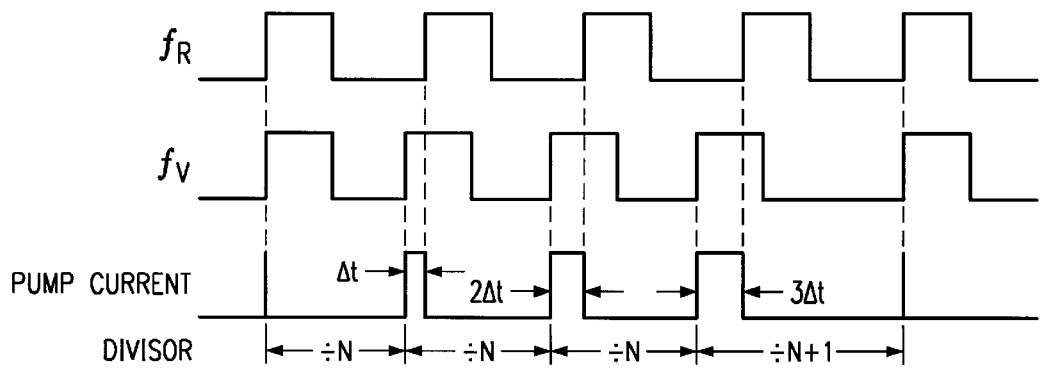
FIG. 3 is a timing diagram for a conventional positive edge fractional-N PLL synthesizer showing phase error for x/m=2/8. (prior art)
Figure 4:
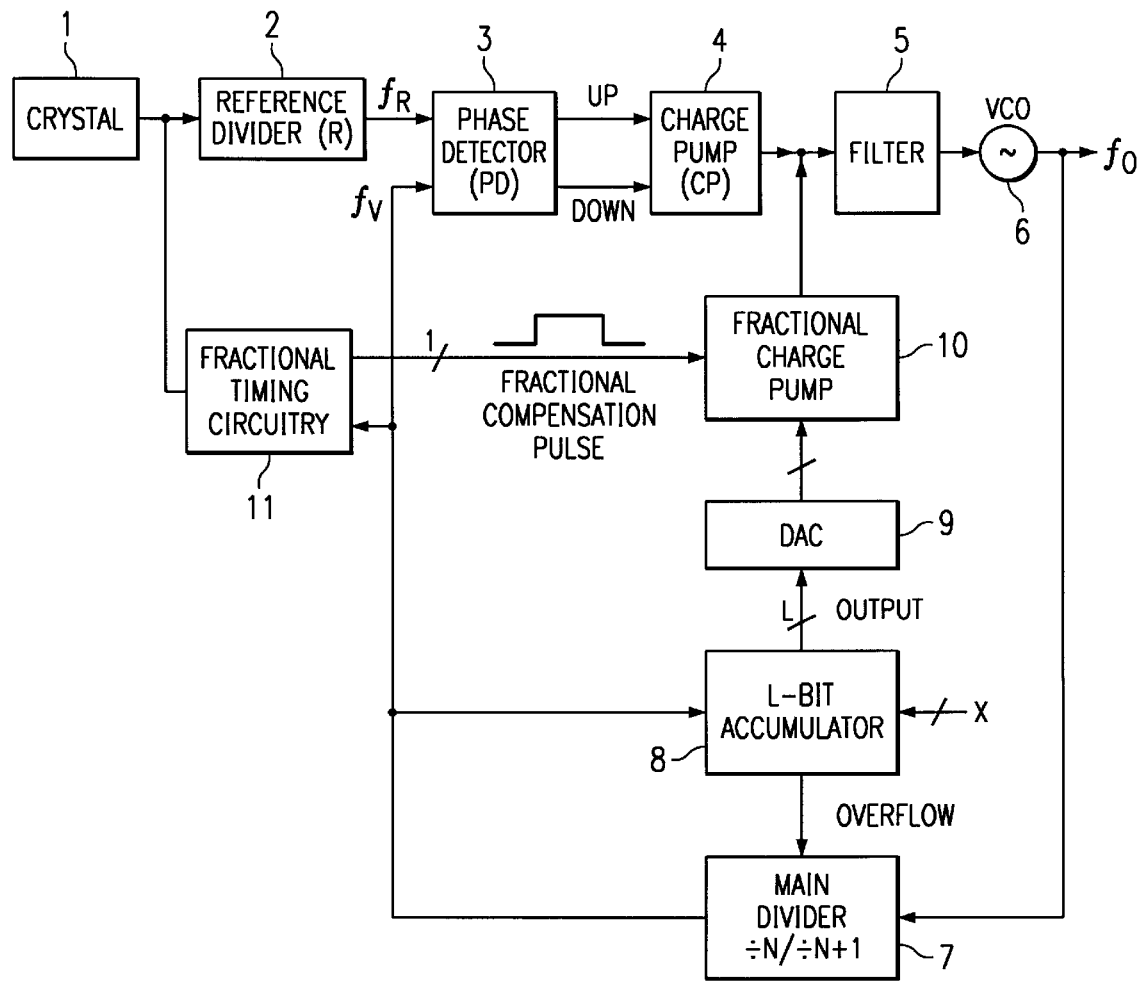
FIG. 4 is a block diagram for a conventional fractional-N synthesizer with spurious sideband compensation circuitry. (prior art)
Figure 5:
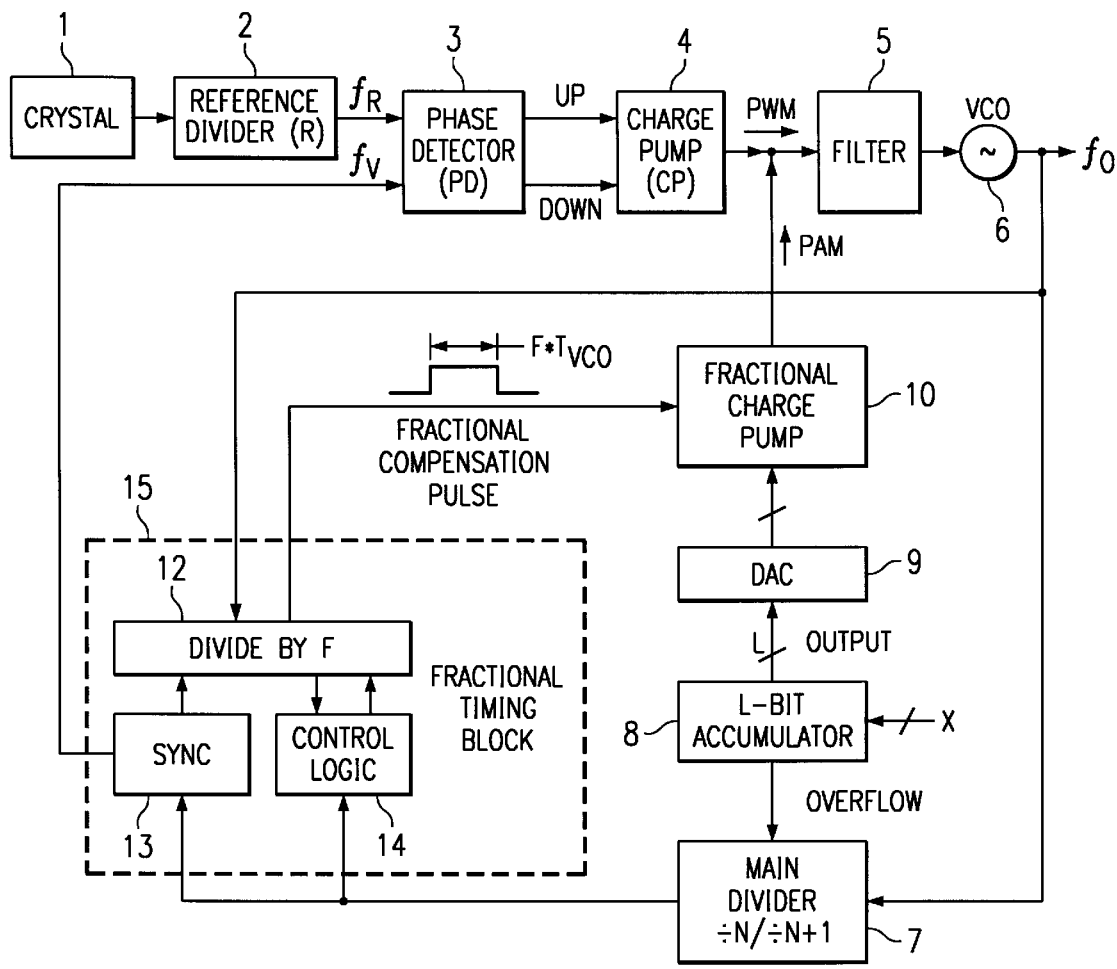
FIG. 5 is a block diagram for the proposed fractional-N PLL synthesizer architecture of the present invention.

The present invention discusses a new fractional-N synthesizer technique where the compensation circuitry of the fractional spurs tracks the variation of the output frequency, $f_O$. In this case, the fractional pulse timing circuitry tracks the output frequency $f_O$ and hence results in effective error cancellation in a fractional-N PLL synthesizer. A preferred embodiment of the invention is discussed in FIG. 5. The fractional timing block 15 is added to the conventional fractional-N circuit, discussed earlier in FIG. 4, to develop a fractional compensation pulse which is a function of $f_O$, to drive the fractional charge pump 10. The fractional timing block 15 is comprised of synchronization circuitry 13 and control logic 14, both of which are driven from the main divider 7, and a divide by F circuit 12 where F is an integer number. The fractional compensation pulse, at the output of divide by F circuit 12, has a value of F*$T_{VCO}$ where $T_{VCO}$ is the period of the VCO 6 output signal $f_O$, so that if the output frequency changes then the fractional pulse width tracks it. The fractional compensation pulse drives the fractional charge pump 10 to provide a pulse amplitude modulated (PAM) cycle at it's output. This PAM signal is then compared to the pulse width modulated (PWM) pulse at the output of the main charge pump 4. Since the fractional timing block 15 is driven at RF frequency rates, one might assume that it consumes high power and would therefore be impractical. However, in copending application No. TI-28061, herein incorporates by reference, a technique is presented which allows the fractional timing function to be implemented using ultra-low power.

Figure 6:
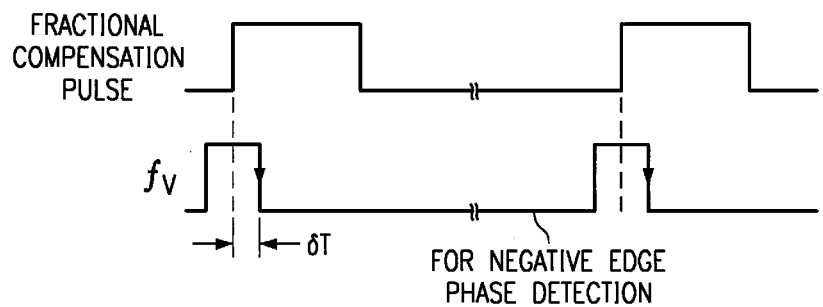
FIG. 6 shows the timing diagram for the fractional compensation pulse.

The timing characteristics between the feedback signal $f_V$ and the fractional compensation pulse is shown FIG. 6. In this fractional-N PLL circuit the phase detector 3 operates on the negative edges of $f_R$ and $f_V$. In this case the fractional pulse has to be high prior to the negative edge of the $f_V$ pulse, as shown. This is insured by the circuitry of the fractional timing block 11.

Figure 7:
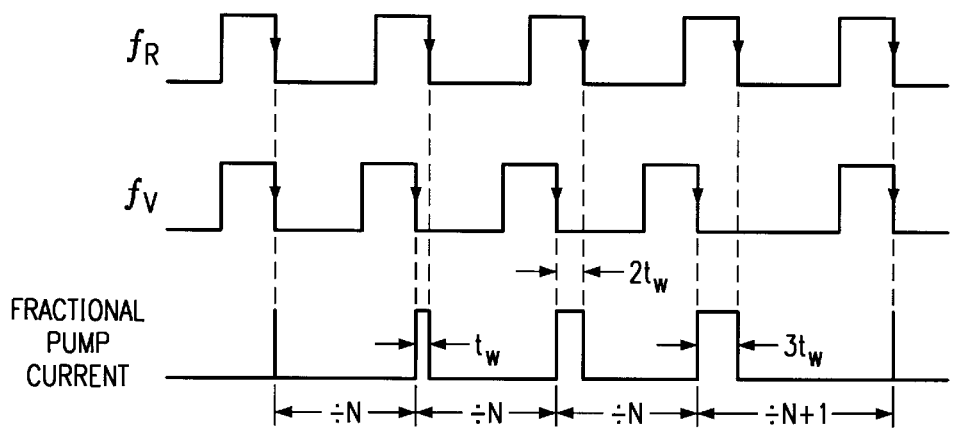
FIG. 7 is a negative edge fractional-N timing diagram for the approach of the present invention showing phase error for x/m=2/8.

The theory of this fractional compensation method is developed below. FIG. 7 shows the phase error in a negative edge fractional-N timing diagram with x/m=2/8. For the case in the time domain where the main divider 7 is dividing by N, then $$t_w = \frac{1}{f_R} - \frac{1}{f_V} = \frac{1}{f_R} - \frac{N}{f_O}. \text{ Also,} \qquad \text{Eq. 1}$$

$$f_O = \left(N + \frac{x}{m}\right) \cdot f_R \qquad \text{Eq. 2}$$

for the case where the PLL is locked, x is the accumulator increment (0, 1, . . . , m−1), and m is the fractional modulus (for 3-bit accumulator, $2^L = 2^3 = 8$).

Now, substituting eq. 2 into eq. 1 gives, $$t_w = \left(N + \frac{x}{m}\right) \cdot \frac{1}{f_O} - \frac{N}{f_O} = \frac{x}{m} \cdot \frac{1}{f_O}. \qquad \text{Eq. 3}$$

so that when x=1, $t_w$ is minimum, and $$t_{w-min} = \frac{1}{m} \cdot \frac{1}{f_O}. \qquad \text{Eq. 4}$$

Now, since the accumulator output reflects the time error (phase error), this error at any time is given by $$t_w = t_{w-min} \cdot \text{FAC, so that} \qquad \text{Eq. 5}$$

$$t_w = \frac{1}{m} \cdot \frac{1}{f_O} \cdot FAC, \qquad \text{Eq. 6}$$

where FAC is the fractional L-bit accumulator content, described below:

For example, for a 3-bit accumulator incremented in steps of two, x=2 and m=8, so that

| Cycle | FAC |
|-------|-----|
| 0 | 0 |
| 1 | 2 |
| 2 | 4 |
| 3 | 6 |
| 4 | 0 |
| 5 | 2 |
| . | . |

Figure 8:
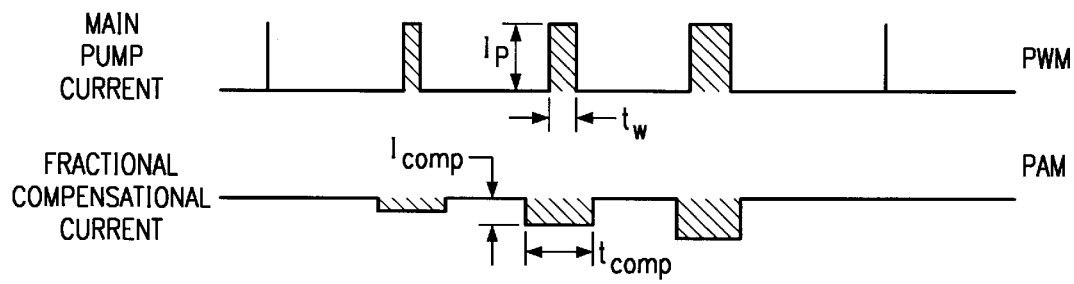
FIG. 8 shows the error charge pump current signals for the circuitry of the present invention (Note: Not to scale).

FIG. 8 shows the current error from the main charge pump 4 and the fractional compensation pump 10. The main pump current is pulse width modulated (PWM) and the fractional compensation current is pulse amplitude modulated (PAM). To cancel the fractional error, the condition $$I_{comp} \cdot t_{comp} = I_p \cdot t_w \qquad \text{Eq. 7}$$

must be satisfied, where $I_p$ is the pump current $t_{comp}$ is the compensation pulse width (constant for a fixed channel), and Icomp is the compensation current (variable in amplitude depending on accumulator count), so that $$I_{comp} = I_p \cdot \frac{tw}{tcomp}. \qquad \text{Eq. 8}$$

Now, combining equations 6 and 8, we get $$I_{comp} = I_p \cdot \left(\frac{FAC}{m} \cdot \frac{Tvco}{tcomp}\right) \qquad \text{Eq. 9}$$

$$f_o = \frac{1}{Tvco}.$$

To make this current ($I_{comp}$) independent of the VCO frequency, then $t_{comp}$ has to be a function of $T_{VCO}$. This means that $t_{comp}$, the fractional pulse width, needs to track the VCO.

Assume that $$t_{comp} = F \cdot T_{VCO}, \qquad \text{Eq. 10}$$

where F is an integer number and multiple of 2.

Now inserting equation 10 into equation 9, we get $$I_{comp} = I_p \cdot \frac{FAC}{m} \cdot \frac{1}{F}, \qquad \text{Eq. 11}$$

which is the ideal compensation current generated by the fractional pump.

Equation 11 shows that as a result of the fractional timing circuitry 15, the compensation current is independent of the VCO frequency. The compensation current is only a function of the main pump current, Ip, and the amplitude controlled accumulator content (FAC), by means of the DAC. Also, the result is a function of the ratios $\frac{1}{m}$ and $\frac{1}{F}$.

Figure 9:
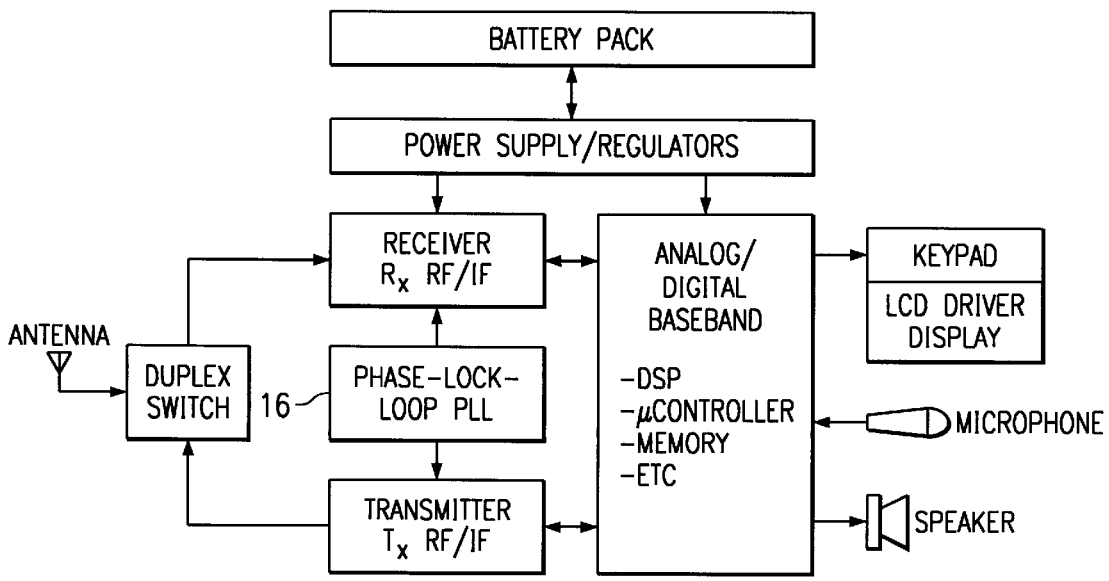
FIG. 9 is a block diagram for a wireless transceiver showing where the PLL of the present invention is used.

FIG. 9 shows a block diagram for a typical wireless transceiver (cellular phone) incorporating the present invention. The system is comprised of the receiver ($R_x$) and transmitter ($T_x$) RF/IF portions, the baseband controller functions, the power supply, and the user input/output functions. Of particular interest relative to this invention is the phase-lock-loop (PLL) 16 circuit. Both fixed-band and particularly multi-band wireless transceivers such as this will benefit significantly from the improved switching time, reduced phase noise, and reduced reference feed through gained from the use of the fractional-N PLL with fractional spur suppression provided by the present invention. The present invention can also be useful in other applications where high speed, low noise PLL's are required.

While the invention has been described in the context of preferred embodiment, it will be apparent to those skilled in the art that the present invention may be modified in numerous ways and may assume many embodiments other that that specifically set out and described above. Accordingly, it is intended by the appended claims to cover all modifications if the invention which falls within the true spirit and scope of the invention.

What is claimed is:

1. A phase-lock-loop circuit, comprising:
    an oscillator;
    a phase detector;
    a filter circuit;
    a first divider circuit;
    a digital to analog converter;
    a second divider circuit coupling said oscillator to said phase detector;
    a charge pump coupling said phase detector to said filter circuit;
    a voltage controlled oscillator coupling said filter circuit to said first divider circuit;
    an L-Bit accumulator coupling said first divider circuit to said digital-to-analog converter;
    a fractional charge pump coupling said digital-to-analog converter to said charge pump and to said filter circuit; and
    a fractional timing circuit coupling said voltage controlled oscillator and said first divider circuit to said phase detector and to said fractional charge pump.

2. The phase-lock-loop circuit of claim 1, wherein:
    an output of said oscillator is coupled to an input of said second divider circuit;
    an output of said second divider circuit is coupled to a first input of said phase detector;
    a first output of said phase detector is coupled to a first input of said charge pump;
    a second output of said phase detector is coupled to a second input of said charge pump;
    an output of said charge pump is coupled to an input of said filter circuit;
    an output of said filter circuit is coupled to an input of said voltage controlled oscillator;
    an output of said voltage controlled oscillator is coupled to an input of said first divider circuit;

an output of said first divider circuit is coupled to at least one input of said fractional timing circuit;

a first output of said fractional timing circuit is coupled to a second input of said phase detector;

a second output of said fractional timing circuit is coupled to a first input of said fractional charge pump;

an output of said fractional charge pump is coupled to said output of said charge pump and said input of said filter circuit;

an output of said L-bit accumulator is coupled to an input of said digital to analog converter;

an output of said digital to analog converter is coupled to an input of said fractional charge pump;

an output of said L-Bit accumulator is coupled to an input of said first divider circuit; and an output of said voltage controlled oscillator is coupled to an input of said fraction timing circuit.

3. The phase-lock-loop circuit of claim 1, wherein said oscillator is a fixed frequency crystal.

4. The phase-lock-loop circuit of claim 1, wherein said second divider circuit is a reference divider and said first divider circuit is a main divider.

5. The phase-lock-loop circuit of claim 1, wherein said fractional timing circuit comprises synchronization circuitry, control logic circuitry and divide by circuitry coupling said synchronization circuitry to said control logic circuitry.

6. The phase-lock-loop circuit of claim 2, wherein: said fractional timing circuit comprises synchronization circuitry, control logic circuitry and divide by circuitry coupling said synchronization circuitry to said control logic circuitry and wherein:

a first output of said synchronization circuitry is coupled to said second input of said phase detector;

a second output of said synchronization is coupled to a first input of said divide by circuit;

a first output of said divide by circuitry is coupled to an input of said fractional charge pump;

a second output of said divide by circuit is coupled to a first input of said control logic circuitry;

an output of said control logic circuitry is coupled to a second input of said divide by circuitry;

an output of said first divider is coupled to a first input of said synchronization circuitry and to a second input of said control logic circuitry; and an output of said voltage controlled oscillator is coupled to a third input of said divide by circuitry.

7. A phase-lock-loop circuit, comprising circuitry for generating a precise fractional pulse width signal having voltage controlled oscillator tracking characteristics, said circuit further including circuitry, coupling an output of said phase-lock-loop to an input of a phase detector within said phase-lock-loop, for: tracking variations in the output frequency ($f_O$) of the phase-lock-loop circuit at the output of a voltage controlled oscillator within said phase-lock-loop; developing compensation current that is independent of voltage controlled oscillator frequency; and developing a pulse-amplitude-modulated fractional compensation pulse having a width that tracks the voltage controlled oscillator frequency.

8. A phase-lock-loop circuit, comprising circuitry for generating a precise fractional pulse width signal having voltage controlled oscillator tracking characteristics, said circuit further including fractional pulse timing circuitry, coupling an output of said phase-lock-loop to an input of a phase detector within said phase-lock-loop, for tracking the output frequency ($f_O$) and circuitry responsive to said fractional pulse timing circuitry for providing effective error cancellation in said phase-lock-loop;

circuitry for tracking the output frequency ($f_O$) and circuitry responsive to said fractional pulse timing circuitry for providing effective error cancellation in said phase-lock-loop; and circuitry for developing compensation current that is independent of voltage controlled oscillator frequency; and developing a pulse-amplitude-modulated fractional compensation pulse having a width that tracks the voltage controlled oscillator frequency.

9. A method for tracking the output frequency ($f_O$) of a phase-lock-loop synthesizer and providing effective error cancellation in said phase-lock-loop, comprising the steps of:

tracking band changes in the output frequency of a voltage controlled oscillator within said phase-lock-loop;

developing compensation current that is independent of voltage controlled oscillator frequency; and developing a pulse-amplitude-modulated fractional compensation pulse having a width that tracks the voltage controlled oscillator frequency.

10. The method of claim 9, wherein said fractional compensation pulse is dependent on main charge pump current and on L-Bit accumulator content.

11. The method of claim 10, wherein a pulse amplitude modulated (PAM) signal is compared to a pulse width modulated (PWM) pulse at an output of a main charge pump.

12. A wireless telephonic system, comprising:

a duplex switch coupling an antenna to a receiver and to a transmitter;

a power supply coupled to said receiver;

a baseband coupling aid power supply to said receiver, transmitter and to a keypad and a speaker;

a microphone coupled to said baseband; and a phase-lock-loop circuit coupling said receiver to said transmitter, said phase-lock-loop including circuitry, coupling an output of said phase-lock-loop to an input of a phase detector within said phase-lock-loop, for tracking variations in the output frequency ($f_O$) of the phase-lock-loop circuit at the output of a voltage controlled oscillator within said phase-lock-loop, said phase-lock-loop circuit comprising:

an oscillator;

a phase detector;

a filter circuit;

a first divider circuit;

a digital to analog converter;

a second divider circuit coupling said oscillator to said phase detector;

a charge pump coupling said phase detector to said filter circuit;

a voltage controlled oscillator coupling said filter circuit to said first divider circuit;

an L-Bit accumulator coupling said divider circuit to said digital-to-analog converter;

a fractional charge pump coupling said digital-to-analog converter to said charge pump and to said filter circuit; and a fractional timing circuit coupling said voltage controlled oscillator and said first divider circuit to said phase detector and to said fractional charge pump, the wireless telephonic system of claim 1, wherein said phase-lock-loop circuit comprises:
an oscillator;
a phase detector;
a filter circuit;
a first divider circuit;
a digital to analog converter;
a second divider circuit coupling said oscillator to said phase detector;
a charge pump coupling said phase detector to said filter circuit;
a voltage controlled oscillator coupling said filter circuit to said first divider circuit;
an L-Bit accumulator coupling said divider circuit to said digital-to-analog converter;
a fractional charge pump coupling said digital-to-analog converter to said charge pump and to said filter circuit; and
a fractional timing circuit coupling said voltage controlled oscillator and said first divider circuit to said phase detector and to said fractional charge pump.

13. The wireless telephonic system of claim 12, wherein said phase-lock-loop circuit further includes circuitry responsive to said fractional pulse timing circuitry for providing effective error cancellation in said phase-lock-loop.3, wherein said phase-lock-loop circuit further includes fractional timing circuitry for tracking the output frequency ($f_O$) and circuitry responsive to said fractional pulse timing circuitry for providing effective error cancellation in said phase-lock-loop.

14. The wireless telephonic system of claim 12, wherein:
an output of said oscillator is coupled to an input of said second divider circuit;
an output of said second divider circuit is coupled to a first input of said phase detector;
a first output of said phase detector is coupled to a first input of said charge pump;
a second output of said phase detector is coupled to a second input of said charge pump;
an output of said charge pump is coupled to an input of said filter circuit;
an output of said filter circuit is coupled to an input of said voltage controlled oscillator;
an output of said voltage controlled oscillator is coupled to an input of said first divider circuit;
an output of said first divider circuit is coupled to at least one input of said fractional timing circuit;
a first output of said fractional timing circuit is coupled to a second input of said phase detector;
a second output of said fractional timing circuit is coupled to a first input of said fractional charge pump;
an output of said fractional charge pump is coupled to said output of said charge pump and said input of said filter circuit;
an output of said L-bit accumulator is coupled to an input of said digital to analog converter;
an output of said digital to analog converter is coupled to an input of said fractional charge pump;
an output of said L-Bit accumulator is coupled to an input of said first divider circuit; and
an output of said voltage controlled oscillator is coupled to an input of said fraction timing circuit.

15. The wireless telephonic system of claim 12, wherein said oscillator is a fixed frequency crystal.

16. The wireless telephonic system of claim 12, wherein said second divider circuit is a reference divider and said first divider circuit is a main divider.

17. The wireless telephonic system of claim 12, wherein said fractional timing circuit comprises synchronization circuitry, control logic circuitry and divide by circuitry coupling said synchronization circuitry to said control logic circuitry.

18. A wireless telephonic system, comprising:
a duplex switch coupling an antenna to a receiver and to a transmitter;
a power supply coupled to said receiver;
a baseband coupling aid power supply to said receiver, transmitter and to a keypad and a speaker;
a microphone coupled to said baseband; and
a phase-lock-loop circuit coupling said receiver to said transmitter, said phase-lock-loop including circuitry for tracking variations in the output frequency ($f_O$) of the phase-lock-loop circuit at the output of a voltage controlled oscillator within said phase-lock-loop, including fractional timing circuitry for tracking the output frequency ($f_O$) and circuitry responsive to said fractional timing circuitry for providing effective error cancellation in said phase-lock-loop, said fractional timing circuit comprising synchronization circuitry, control logic circuitry and divide by circuitry coupling said synchronization circuitry to said control logic circuitry and wherein:
a first output of said synchronization circuitry is coupled to said second input of said phase detector;
a second output of said synchronization is coupled to a first input of said divide by circuit;
a first output of said divide by circuitry is coupled to an input of said fractional charge pump;
a second output of said divide by circuit is coupled to a first input of said control logic circuitry;
an output of said control logic circuitry is coupled to a second input of said divide by circuitry;
an output of said first divider circuitry is coupled to a first input of said synchronization circuitry and to a second input of said control logic circuitry; and
an output of said voltage controlled oscillator is coupled to a third input of said divide by circuitry.

\* \* \* \* \*